United States Patent [19]

Gumm et al.

[11] 4,410,879
[45] Oct. 18, 1983

[54] HIGH RESOLUTION DIGITAL-TO-ANALOG CONVERTER

[75] Inventors: Linley F. Gumm, Beaverton; Steven R. Morton, Portland, both of Oreg.

[73] Assignee: Tektronix, Inc., Beaverton, Oreg.

[21] Appl. No.: 202,557

[22] Filed: Oct. 31, 1980

[51] Int. Cl.³ ............................................ H03K 13/02
[52] U.S. Cl. ...................... 340/347 DA; 340/347 CC; 340/347 M
[58] Field of Search ................. 340/347 DA, 347 CC, 340/347 M

[56] References Cited

U.S. PATENT DOCUMENTS

| | | | |
|---|---|---|---|
| 3,581,304 | 5/1971 | Paradise et al. | 340/347 M X |
| 3,893,102 | 7/1975 | Candy | 340/347 DA |
| 3,995,266 | 11/1976 | Muller et al. | 340/347 M X |

OTHER PUBLICATIONS

The Engineering Staff of Analog Devices, Inc., Analog–Digital Conversion Handbook, 6/1972, pp. II-56 to II-59.

Primary Examiner—T. J. Sloyan
Attorney, Agent, or Firm—George T. Noe

[57] ABSTRACT

An apparatus and method for expanding the resolution of digital-to-analog converters is described. Two limited resolution digital-to-analog converters are cascaded in such a manner that one converts the low order bits of digital input signal and the other converts the higher order bits. The output of the higher order digital-to-analog converter is applied directly to a summing circuit while the output of the low order digital-to-analog is first passed through an attenuator. When the low order digital-to-analog converter receives all logical ones, a carry is performed to the higher order digital-to-analog converter. The low order analog-to-digital converter is then reset by a successive approximation technique. Operation is essentially the same for borrow operation.

6 Claims, 1 Drawing Figure

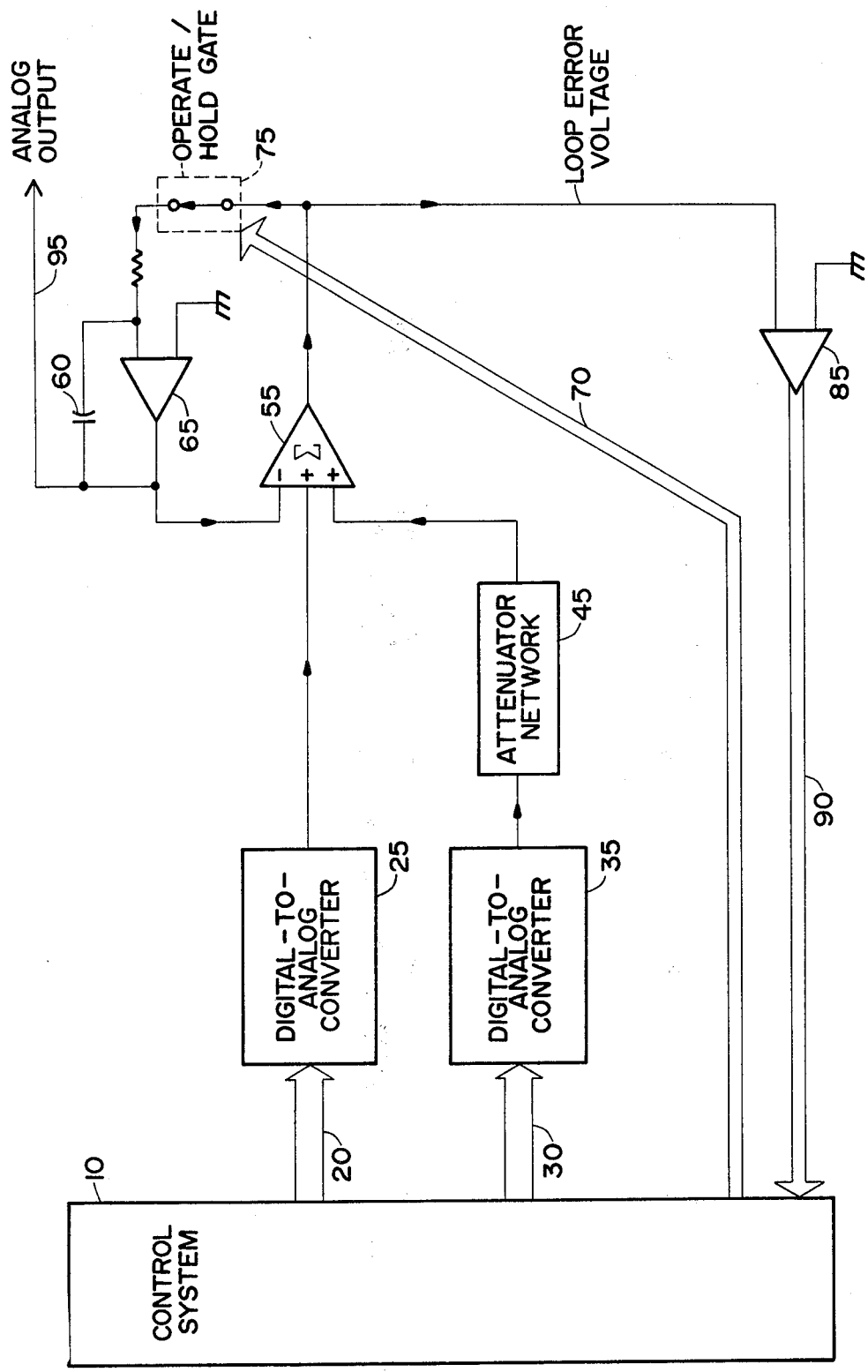

HIGH RESOLUTION DIGITAL-TO-ANALOG CONVERTER

BACKGROUND OF THE INVENTION

The present invention relates generally to digital-to-analog converters and more particularly to a circuit for expanding the resolution of such converters.

In many control applications it is necessary to convert a digital signal, such as the output of a computer, to an analog equivalent in order to effect control. There are, of course, commercially available digital-to-analog converters (hereinafter referred to as DAC's) capable of performing this function. However, it is often desired to control a voltage to a greater degree of precision that is possible with present-day commercially-available DAC's. For example, while there are such converters available having as high as 12-bit or even 16-bit monotonic resolution (i.e., successive steps of an increasing signal are of substantially equal non-deteriorating increments), it would be desirable to have converters having as much as 18-bit to 22-bit performance. As a consequence, various techniques have been proposed to increase the resolution of the available converters. Some of these proposals include multiple DAC's with read-only memory-based correction circuits, and voltage or current regulation schemes to provide additional bits. However, such proposals have generally resulted in circuits that are cumbersome and expensive.

SUMMARY OF THE INVENTION

According to the present invention, there is provided a circuit for increasing the resolution of a digital-to-analog converter (DAC). Two DAC's are cascaded in such a manner that a first one converts the high order bits of the digital input and a second one converts the low order bits. Thus, two limited resolution DAC's are utilized to achieve a monotonic resolution approaching that of a converter having as many bits of precision as the sum, minus one bit, of the two devices used. The overall accuracy, however, is only about as good as that of the higher-order-bit DAC.

The output of the first DAC is applied unattenuated to a summing circuit to provide the higher-order conversion. The output of the second DAC is attenuated to appropriately scale the second DAC output to the first DAC output in accordance with the quantization weight of the lower order bits before being applied to the summing circuit, and thus the second DAC provides the lower-order conversion. The amount of attenuation is such that the output of the attenuator is greater than the sum of the least significant bit and the maximum error of the first DAC when the second DAC is shifted from its lowest state to its highest state. Thus, some overlap is provided between the two converters.

When the second or low order DAC has filled, a carry operation is performed. This is accomplished by temporarily storing the present summed output of both DAC's and incrementing the first or high order DAC by one least significant bit. The low order DAC is then set by a successive approximation process so that its output plus the output of the high order DAC equals the stored value of the previous output.

This system permits an m-bit digital signal to be converted to an analog equivalent by a pair of n-bit DAC's, wherein $n=(m+1)/2$, or $m=2n-1$, because the two n-bit converters are going to overlap by at least one bit.

It is therefore one object of the present invention to provide a circuit for cascading digital-to-analog converters.

It is another object of the present invention to provide a circuit for cascading digital-to-analog converters to achieve monotonic resolution approaching the sum of the resolutions of the converters used.

The foregoing and numerous other objects, advantages, and inherent functions of the invention will become apparent as the following description of a preferred embodiment thereof is read in conjunction with the accompanying drawing.

BRIEF DESCRIPTION OF THE DRAWING

The single drawing FIGURE is a block diagram of a digital-to-analog converter in accordance with a preferred embodiment of the present invention.

DETAILED DESCRIPTION OF THE PREFERRED EMBODIMENT

Referring to the drawing FIGURE, a block diagram of a digital-to-analog converter according to the present invention is shown. An 2n-bit digital signal (parallel data) which is to be converted to analog voltage or current is split into n higher order bits and n lower order bits, and enters the system via bus 20 and bus 30 respectively. This data originates from a control system 10, which may suitably be a commercially-available microprocessor system. Control system 10 is capable of providing the digital data to be converted, performing the well-known successive approximation method of analog-to-digital conversion, and opening and closing switch contacts or the like. Although such a control system can be constructed solely from known hardware elements, it may be more convenient to use a microprocessor system with related circuitry to effect the above functions as is done in the preferred embodiment.

In the circuit built and tested, the 2n-bit input signal carried by buses 20 and 30 comprises 24 parallel data bits. The 12 higher-order bits are input over bus 20 while the 12 lower order bits are input over bus 30. Bus 20 is connected to a first digital-to-analog converter (DAC) 25 which may suitably have 12-bit resolution, that is, $2^{12}$ (4096) discrete output levels. DAC 25 is utilized to convert the high order bits of the input digital data. Bus 30 is connected to a second DAC 35, which may have the same resolution as DAC 25. DAC 35 is utilized to convert the low order bits of the input digital data. As will be seen, converters 25 and 35 overlap by one or more bits so that the overall expanded resolution is equal to or less than 23 bits.

The output of converter 25 is directly coupled to one input of a summing amplifier 55, while the output of converter 35 is coupled to another input of summing amplifier 55 via attenuator network 45. The purpose of attenuator network 45 is to scale the output of DAC 35 to the output of DAC 25, since the full-scale output of DAC 35 should be equivalent to the output of DAC 25 caused by one bit of change. Attenuator network 45 may be a simple resistive network. The amount of attenuation, or scaling factor, provided dependends upon the quantization weight or value attributed to the lower order bits and the higher order bits, and the amount of bit overlap desired between converter 25 and converter 35. A minimum of one-bit overlap is required to compensate for certain inherent errors of the converters (primarily precision of the least significant bit).

An output correction loop includes a summing amplifier, an integrator, and a switch for generating the converted analog output voltage. Summing amplifier 55 receives as a third input the output of an integrator circuit comprising operational amplifier 65 and capacitor 60. The output of the integrator is the analog output of the overall digital-to-analog converter. In operation, the output of integrator 65, 60 will attempt to match the summed outputs of DAC's 25 and 35 so that the output of summing amplifier 55 is a nullity, i.e., zero volts. Thus, any output of summing amplifier 55 may be looked upon as an error signal. The gain of summing amplifier 55 is great enough to magnify a least significant bit (of DAC 35) of change into a signal which is large enough to operate a comparator 85 (to be discussed later). The output of amplifier 55 is fed via switch 75 to one input of operational amplifier 65, while capacitor 60 is connected between the same input and the output terminal of operational amplifier 65. The other input of operational amplifier 65 is connected to a source of ground potential. If the input voltage to operational amplifier 65 is removed by opening gate 75, capacitor 60 will function as a temporary memory.

Gate 75 may be any conventional kind of electronic switch. For example, one embodiment of the present invention utilizes a field-effect transistor switch while another embodiment may utilize a reed relay. In addition to being coupled to operational amplifier 65 via switch 75, the output voltage of summing amplifier 55 is directly connected to one input of a comparator 85. The other input of comparator 85 is connected to a suitable reference voltage, such as ground potential. The output of comparator 85 is fed back to control system 10 as an error-sense signal over line 90.

In order to better understand the operation of the present invention, assume that gate 75 is in the operate (closed) position and data of increasing value (such as data representative of a sawtooth signal) are being passed over buses 20 and 30 to DAC's 25 and 35. The output of summing amplifier 55 will be at zero volts under normal operating conditions because the integrator 60,65 operates to provide a subtraction voltage equal to the sum of the voltage outputs from both DAC's, as mentioned earlier. As the data sent over bus 30 increases in value (the data on bus 20 remains all zeros until the higher order, or more significant bits, are reached), DAC 35 will eventually receive at the input thereof all logical ones. To increase the converted value beyond this point, a carry operation must be performed. A carry is initiated when control system 10 opens gate 75, thereby placing it in the hold mode. The opening of gate 75 removes the input to operational amplifier 65 and the voltage across capacitor 60 remains constant at the present stored value. Control system 10 then increments DAC 25 by one least significant bit and resets all of the inputs of DAC 35 to logical zeros. The outputs of converters 25 and 35 are summed in amplifier 55. The difference between the voltage temporarily stored in capacitor 60 and the new output voltages of DAC 25 and attenuator network 45 is amplified by summing amplifier 55 to provide an error voltage. This error voltage is fed to comparator 85 where it is compared with ground to sense the presence and polarity of the error voltage.

Next, control system 10 sets the most significant bit of converter 35 to logical one over bus 30. The analog equivalent output of converter 35 is attenuated by attenuator network 45 and fed to summing amplifier 55. This loop error voltage from summing amplifier 55 is compared with ground by comparator 85. The output of comparator 85 will be HIGH if the sum of the outputs of digital-to-analog converters 25 and 35 is greater than the previous value stored by capacitor 60 and it will be LOW if the sum is less than the previous value. If the output of comparator 85 is HIGH, the most significant bit of DAC 35 is reset by control system 10 to a logical zero. Conversely, if the output on line 90 is LOW, control system 10 allows the most significant bit of DAC 35 to remain a logical one.

Control system 10 now sets the next most significant bit of DAC 35 to a logical one and reads the output of comparator 85 on line 90. If the output on line 90 is HIGH, this bit is reset to a logical zero; but if it is LOW, this bit is allowed to remain a logical one. The above procedure is repeated for each bit of DAC 35. When the least significant bit of the converter 35 has been established in this manner, the combined output of DAC 35 and DAC 25 will be substantially equal (to the degree permitted by the precision of the least significant bit of the low-order DAC) to the output of the overall digital-to-analog converter prior to the beginning of the carry cycle. Control system 10 now closes gate 75, placing it in the operate mode. Since the output of summing amplifier 55 is the same as before the carry cycle was executed, i.e., zero volts, there will be no undesired variations in the analog output on line 95, and the conversion may continue as the data on buses 20 and 30 continues to increase in value.

While only a carry cycle is described it will be obvious to one skilled in the art that the present invention functions the same in the opposite direction. More specifically, a borrow cycle is implemented by decrementing DAC 25 by one least significant bit and resetting DAC 35 by the same successive approximation technique described above.

From the foregoing it will be seen that there is provided a new and novel arrangement for cascading digital-to-analog converters to improve conversion resolution wherein the objectives set forth hereinabove are efficiently achieved. Since certain changes in the above described circuit arrangement will occur to those skilled in the art without departure from the scope of the invention, it is intended that all matter contained in the description and shown in the drawings shall be interpreted as illustrative and not in a limiting sense.

What we claim as being novel is:

1. A high-resolution digital-to-analog converter for converting a multiple-bit digital signal to its corresponding analog representation, comprising:
   a first DAC for converting the higher order bits of said digital signal to a first analog value;
   a second DAC for converting the lower order bits of said digital signal to a second analog value, wherein the lower order bits converted by said second DAC and the higher order bits converted by said first DAC overlap by at least one bit;
   means for scaling said second analog signal to said first analog value in accordance with the quantization weight of the lower order bits;
   means for combining said first analog value with the scaled second analog value to produce said analog representation; and
   means for controlling said first and second DAC's and said combining means to permit mathematical carry and borrow operations of said DAC's without causing a change in said analog representation during said mathematical carry and borrow operations.

2. A high resolution digital-to-analog converter in accordance with claim 1 wherein said scaling means comprises an attenuator connected to the output of said second DAC.

3. A high resolution digital-to-analog converter in accordance with claim 1 wherein said combining means comprises an algebraic summer and an integrator arranged in a correction loop, wherein the output of said summer is an error voltage that is integrated by said integrator to produce said analog representation and the inputs to said summer are said first analog value, said scaled second analog value, and the output of said integrator.

4. A high resolution digital-to-analog converter in accordance with claim 3 wherein said control means comprises a digital control system.

5. A high resolution digital-to-analog converter in accordance with claim 4 wherein said correction loop further includes a switch interposed between the output of said summer and the input of said integrator, said switch being controlled by said control system to interrupt the integrator input during said carry and borrow operations to thereby temporarily hold the analog representation at the value stored by said integrator.

6. A high-resolution integrator in accordance with claim 4 further comprising an error-sense circuit connected between said correction loop and said control system, said error-sense circuit including a comparator for detecting the presence and polarity of said error voltage.

* * * * *